United States Patent [19]
Taguchi et al.

[11] Patent Number: 5,198,880
[45] Date of Patent: Mar. 30, 1993

[54] SEMICONDUCTOR INTEGRATED CIRCUIT AND METHOD OF MAKING THE SAME

[75] Inventors: Minoru Taguchi, Oomiya; Hiroshi Mochizuki, Musashino, both of Japan

[73] Assignee: Kabushiki Kaisha Toshiba, Kawasaki, Japan

[21] Appl. No.: 784,605

[22] Filed: Oct. 28, 1991

Related U.S. Application Data

[63] Continuation of Ser. No. 540,323, Jun. 19, 1990, abandoned.

[30] Foreign Application Priority Data

Jun. 22, 1989 [JP] Japan ................. 1-160055

[51] Int. Cl.$^5$ ............. H01L 27/02; H01L 29/72
[52] U.S. Cl. ................. 357/214; 257/273; 257/274; 257/213; 257/369; 257/370; 257/371; 257/378
[58] Field of Search ............. 357/42, 43, 24; 437/53, 437/54, 24

[56] References Cited

U.S. PATENT DOCUMENTS

| 4,130,826 | 12/1978 | Bachle et al. | 357/43 |
|---|---|---|---|
| 4,152,715 | 5/1979 | Wang | 351/35 |
| 4,231,810 | 11/1980 | Jäntsch et al. | 437/53 |
| 4,247,788 | 1/1981 | Bluzer | 357/43 |
| 4,642,877 | 2/1987 | Garner et al. | 437/54 |
| 4,764,480 | 8/1988 | Vora | 437/54 |
| 4,855,244 | 8/1987 | Hutter et al. | 437/54 |
| 4,859,624 | 8/1989 | Goto | 437/53 |
| 4,879,255 | 11/1989 | Deguchi et al. | 437/59 |
| 4,918,026 | 4/1990 | Kosiak et al. | 351/43 |
| 4,926,233 | 5/1990 | Hutter | 351/43 |
| 4,943,536 | 7/1990 | Havemann | 437/59 |
| 4,975,750 | 12/1990 | Hayashi et al. | 351/34 |
| 4,994,888 | 2/1991 | Taguchi et al. | 357/43 |
| 5,060,044 | 10/1991 | Tomassetti | 357/43 |

FOREIGN PATENT DOCUMENTS

| 57-103347 | 6/1982 | Japan. | |
| 58-128767 | 8/1983 | Japan. | |
| 59-200459 | 11/1984 | Japan | 437/56 |
| 63-0161 | 1/1988 | Japan. | |
| 1-185970 | 7/1989 | Japan. | |

OTHER PUBLICATIONS

Terman, "Combining bipolar and FET devices on a single silicon substrate", IBM TDB, vol. 11, No. 10, Mar./1969 pp. 1270-1271.

Chang, "FET-Bipolar integration", IBM TDB, vol. 14, No. 1, Jun./1971, pp. 350-351.

Primary Examiner—Eugene R. LaRoche
Assistant Examiner—Viet Q. Nguyen
Attorney, Agent, or Firm—Finnegan, Henderson, Farabow, Garrett and Dunner

[57] ABSTRACT

For providing a semiconductor integrated circuit device including CCD type, bipolar type and MOS type integrated circuits in only one chip, island-shaped epitaxial layers of opposite conductivity type are disposed in a semiconductor substrate of one conductivity type having a low impurity concentration. A field oxide layer is provided so as to surround a periphery of an exposed surface of each epitaxial layer. A buried layer of opposite conductivity type having a high impurity concentration is is interposed between the semiconductor substrate and each epitaxial layer in such a manner that at least one edge thereof terminates to the lower surfaace of the field oxide layer. The CCD type integrated circuit is provided in the semiconductor substrate, and the bipolar type and MOS type integrated circuits are arranged in the epitaxial layers.

6 Claims, 5 Drawing Sheets

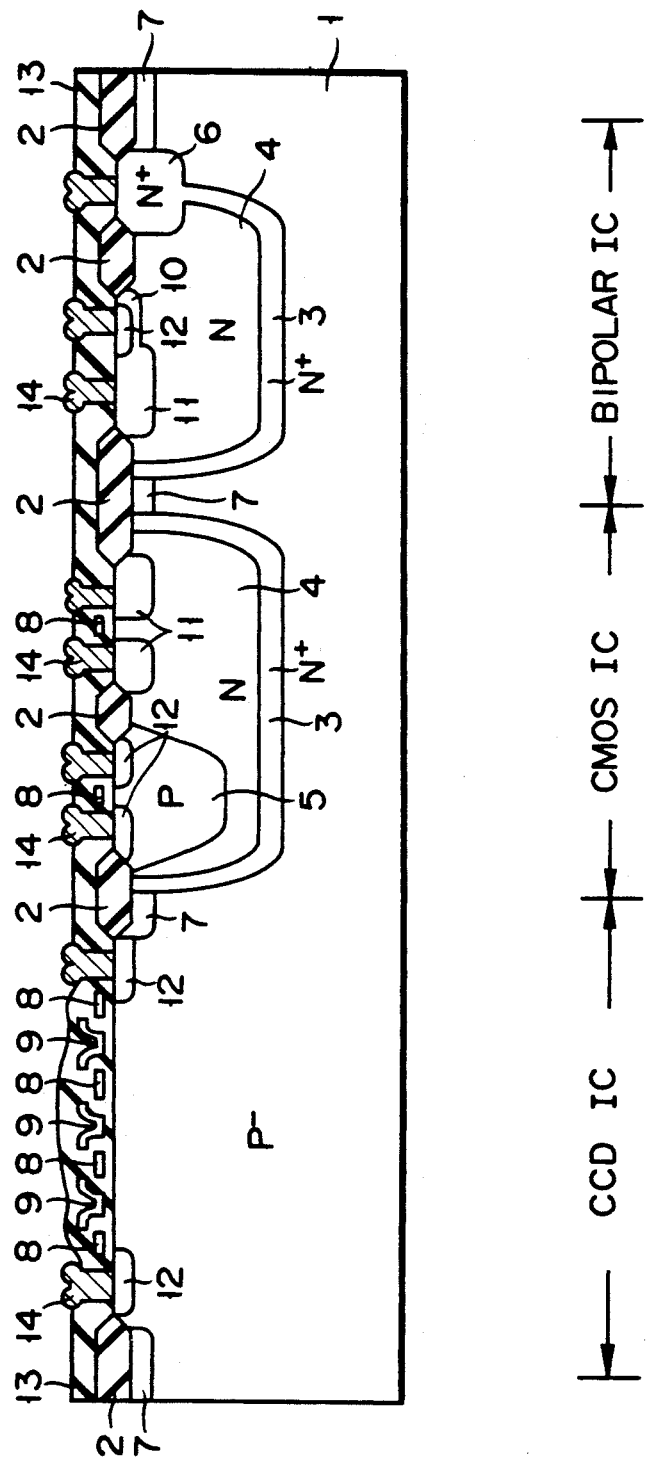
F I G. 1

SEMICONDUCTOR INTEGRATED CIRCUIT AND METHOD OF MAKING THE SAME

This application is a continuation of application Ser. No. 07/540,323, filed Jun. 19, 1990, now abandoned.

BACKGROUND OF THE INVENTION

1. Field of the Invention

The present invention relates to a semiconductor integrated circuit and a method of making the same, and more particularly, to a semiconductor integrated circuit device which includes at least a CCD type integrated circuit and a bipolar type integrated circuit in a single chip and a method of making the same.

2. Description of the Related Art

With development of fine pattern technology in integrated circuits (ICs) or large scale integrated circuits (LSIs), various compact electronic devices having multifunctions and low power consumption have been recently developed. A compact device, which employs a package having many pins and accommodating at least one IC or LSI chip, has been required, and a multi-chip module has been also commercially available.

Further, in a CCD (Charge Coupled Device) type IC, it is easy to increase its integration density and to reduce its power consumption. Therefore, the CCD type IC has been used for solid state image pickup devices such as line sensors, area sensors, etc, and CCD delay devices. In a CCD type LSI used for video signal processing of TV receivers or video tape recorders, it has been performed to mount a plurality of CCD type and bipolar type LSI chips on a single package.

At any rate, however, the multi-chip techniques described above have the following disadvantages.

(1) Since discrete ICs are combined, it is difficult to constitute a device corresponding to a desired system.

(2) Since electrodes among chips are electrically connected by wire bonding or the like, a high-speed operation of the device cannot be obtained due to long wiring structure.

(3) It is difficult to obtain a compact device by decreasing the number of pins.

(4) Since the package becomes large, reliability of the device is lowered due to cracks of a pellet or deterioration of humidity resistance.

(5) There is a limit to decrease the power consumption of the device.

A CCD type integrated circuit requires a predetermined breakdown voltage. At the same time, for providing CCD type, bipolar type, and MOS type integrated circuits in a semiconductor substrate, isolated regions arranged in the semiconductor substrate must have good isolation characteristics.

SUMMARY OF THE INVENTION

It is an object of the present invention to provide a semiconductor integrated circuit device in which CCD type, bipolar type, and MOS type integrated circuits are provided in one semiconductor chip to eliminate the described disadvantages of the multi-chip techniques.

It is another object of the present invention to provide a semiconductor integrated circuit device having an isolation structure suitable for forming CCD type, bipolar type, and MOS type integrated circuits in one semiconductor chip.

It is still another object of the present invention to provide a method of making the above semiconductor integrated circuit device without using a complicated process.

According to an aspect of the present invention, there is provided a semiconductor integrated circuit device which comprises island-shaped epitaxial layers of opposite conductivity type selectively provided in a major surface of a semiconductor substrate of one conductivity type having a low impurity concentration, a field insulating layer surrounding a periphery of an exposed surface of each of the epitaxial layers, and a buried layer of opposite conductivity type having a high impurity concentration, terminating to the field insulating layer and covering each epitaxial layer. The CCD type, bipolar type, and MOS type integrated circuits are arranged on a part of the major surface of the semiconductor substrate, each epitaxial layer, and another part of the major surface of the semiconductor substrate and/or another epitaxial layer, respectively.

According to another aspect of the present invention, there is provided a method of making the semiconductor integrated circuit device according to a principle incorporated in the firstly referred aspect of the present invention.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

FIG. 1 is a sectional view schematically showing a semiconductor integrated circuit device according to the first embodiment of the present invention;

DETAILED DESCRIPTION OF THE PREFERRED EMBODIMENTS

Figure 2A:
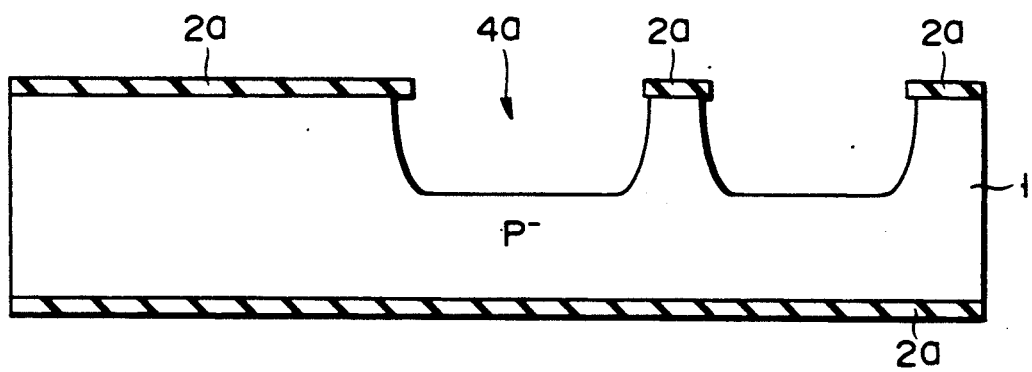
FIGS. 2A to 2E are sectional views schematically showing fabrication processes for the semiconductor integrated circuit device in FIG. 1.

A semiconductor integrated circuit device according to the first embodiment of the present invention is shown in FIG. 1, and fabrication processes for the integrated circuit device are shown in FIGS. 2A to 2E.

In FIG. 1, the semiconductor integrated circuit device comprises N-type island-shaped epitaxial layers 4 which are provided so as to be exposed on a major surface of a P$^-$-type silicon substrate, field oxide layers 2 each surrounding a periphery of the exposed surface of each epitaxial layer, N$^+$-type buried layers 3 each being connected to each field oxide layer 2 and covering each epitaxial layer 4, a CCD type IC provided on a P$^-$-type surface layer of the substrate 1, a bipolar type IC disposed in epitaxial layers 4, and a CMOS type IC provided in another epitaxial layers 4. Note that FIG. 1 is a sectional view in which an arrangement of the CCD type, bipolar type, and CMOS type ICs is partially represented as a typical example.

A method of making the integrated circuit device according to the first embodiment will be described below with reference to FIGS. 2A to 2E, and the detailed structure of the circuit will also be described.

The P⁻-type silicon substrate 1 having a resistivity of about 50 Ω.cm is thermally oxidized at a temperature of 1,000° C. to form a silicon oxide film 2a having a thickness of 1 μm. The oxide film 2a is selectively removed by lithography techniques to provide both an intended region for forming a CMOS type IC (hereinafter referred to a CMOS portion) and an intended region for forming a bipolar type IC (hereinafter referred to as bipolar portion). Using the remaining oxide film 2a as a mask, the P⁻-type silicon substrate 1 is etched by about 10 μm with a solution of hydrofluoric acid/nitric acid system, thereby providing island-shaped recessed portions 4a (FIG. 2A).

Figure 2B:
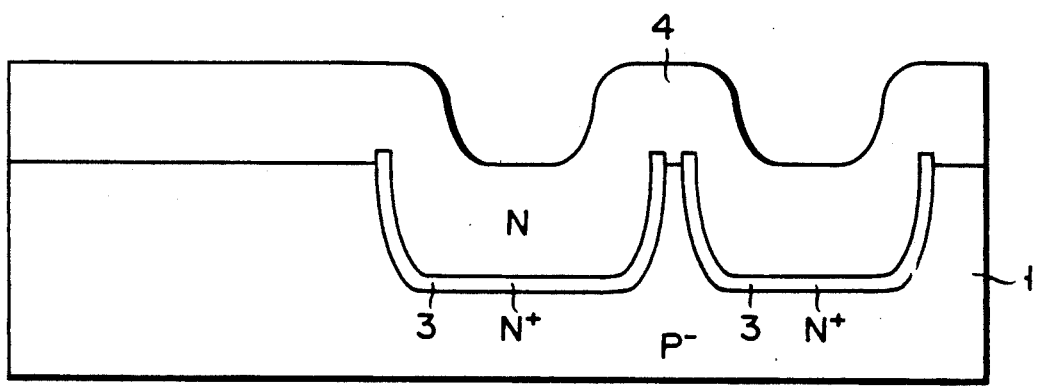

The inner surface of each recessed portion 4a is doped with an N-type impurity of sb (antimony) to form the N⁺-type buried layer 3 having a high impurity concentration represented by a sheet resistance of about 20 Ω/□. After the silicon oxide film 2a is etched away, P (phosphorus) doped N-type epitaxial layer 4 having a thickness of 10 μm and a resistivity of 2 Ω.cm is epitaxially grown on the substrate surface to fill the recessed portions 4a therewith (FIG. 2B).

Figure 2C:
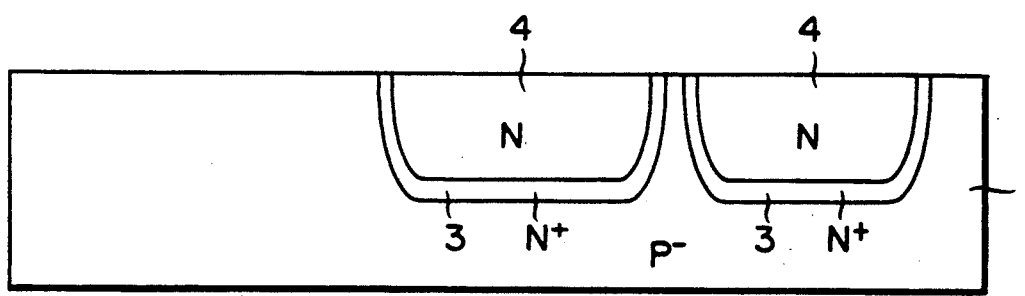

The N-type epitaxial layer is removed by about 12 μm, using lapping and polishing techniques. In this case, the epitaxial layer is removed until the substrate surface is completely exposed (FIG. 2C).

A P-type well diffusion layer 5 and an N⁺-type diffusion layer 6 for a collector contact having a high impurity concentration are formed by an impurity diffusion process at a temperature of 1,100° C. in the epitaxial layers 4 of the CMOS portion and the bipolar portion, respectively. The substrate surface is thermally oxidized at a temperature of 1,000° C. to form a silicon oxide film having a thickness of 900 Å (not shown), on which a silicon nitride film having a thickness of 2,000 Å is deposited by LPCVD techniques. The silicon nitride film is removed except for active regions. In order to prevent unwanted field inversion, B (boron) ions are implanted into the P⁻-type silicon substrate through openings formed by selectively removing the silicon nitride film. Thereafter, LOCOS oxidation is performed for the substrate surface to form field oxide films 2 having a thickness of 8,000 Å, thereby providing a P-type inversion prevention layer 7 just under the filed oxide films 2.

Figure 2D:
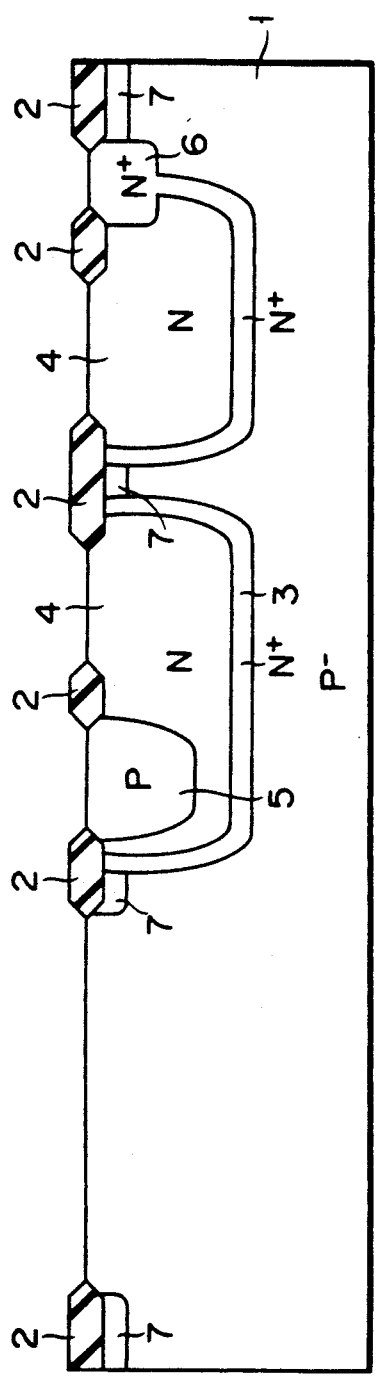

The silicon nitride film (thickness of 2,000 Å) used as an anti-oxidation mask and the silicon oxide film (thickness of 900 Å) are removed (FIG. 2D).

A first gate oxide film having a thickness of 700 Å is formed at a temperature of ·1,000° C. on both an intended region for forming a CCD type IC (hereinafter referred to as CCD portion), i.e., the P⁻-type surface layer of the substrate 1 and the exposed surface of the epitaxial layers 4 of the CMOS portion. Thereafter, P (phosphorus) ions and B (boron) ions are respectively implanted into the CCD portion and the CMOS portion to control a threshold voltage Vth. Thereafter, an N⁺-type first polysilicon film having a thickness of 4,000 Å and containing a high impurity concentration of P (phosphorus) is deposited on the substrate. Using a resist layer as a mask, the polysilicon film is etched by RIE (Reactive Ion Etching) techniques to provide first gate electrodes 8 of the CCD type IC and gate electrodes 8 of the MOSFET. After the exposed first gate oxide film is removed, a second gate oxide film having a thickness of 700 Å is formed on the substrate surface at a temperature of 1,000° C. B (boron) ions are implanted into the CCD portion, and B (boron) ions are also implanted into the bipolar portion so as to provide an inner base layer 10. Thereafter, an N⁺-type second polysilicon film containing at a high impurity concentration of P (phosphorus) and having a thickness of 4,000 Å is deposited on the substrate surface.

Note that the above N⁺-type first and second polysilicon films are formed by, for example, depositing a non-doped polysilicon film on the substrate surface, forming a P (phosphorus) layer, serving as an impurity concentration of P (phosphorus) and having a thickness of 4,000 Å is deposited on the substrate surface.

Note that the above N⁺-type first and second polysilicon films are formed by, for example, depositing a non-doped polysilicon film on the substrate surface, forming a P (phosphorus) layer, serving as an impurity source, on the polysilicon film, and diffusing the P (phosphorus) into the polysilicon film respectively.

Figure 2E:
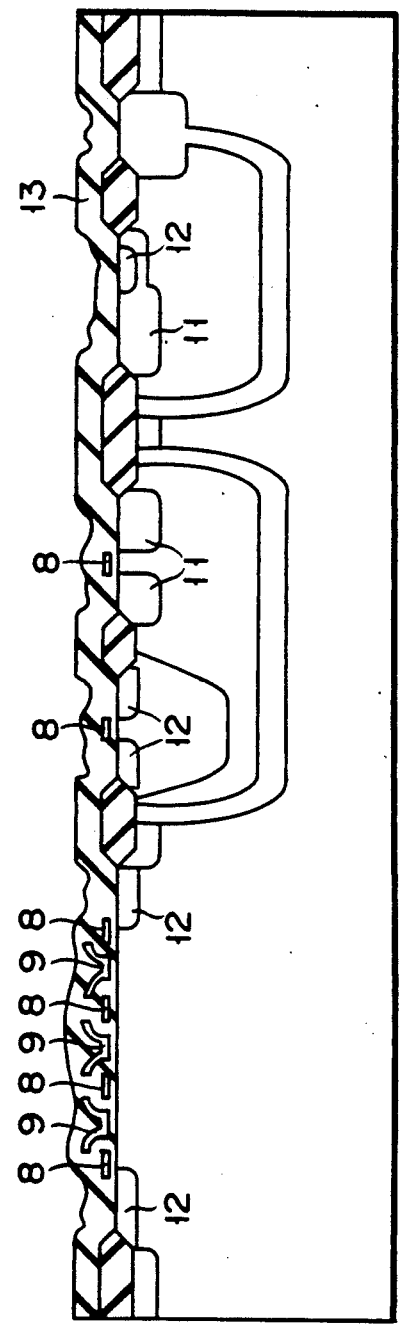

Using a resist layer as a mask, the second polysilicon film is etched by RIE (Reactive Ion Etching) techniques to provide second gate electrodes 9 of the CCD portion. Subsequently, As (arsenic) ions are selectively implanted into the substrate to provide predetermined regions of the CCD portion, source and drain regions of an NMOSFET in the CMOS portion, and an emitter region of the bipolar portion, respectively. The surface of the substrate is then oxidized at a temperature of 900° C. in a dry O₂ atmosphere. Thereafter, B (boron) ions are selectively implanted into the substrate to provide source and drain regions of a PMOSFET in the CMOS portion and a external base region of the bipolar portion. The substrate surface is covered with an insulating film 13 composed of a silicon oxide film containing no impurity and a BPSG film. Thereafter, melting and phosphorus gettering treatments are performed at a temperature of 950° C. P⁺-type diffused regions 11 and N⁺-type diffused regions 12 are activated by these treatments (FIG. 2E).

Using a resist layer as a mask, insulating film 13 is etched by RIE techniques to form contact holes. After an Al-Si (1%) film having a thickness of 8,000 Å is deposited on the surface of the substrate, it is selectively etched by RIE techniques to form electrode wiring films 14. Finally, a forming gas treatment is performed for the substrate at a temperature of 450° C. (FIG. 1).

According to this embodiment, the CCD type, bipolar type, and CMOS type integrated circuits are provided in the P⁻-type surface layer of the substrate, one N-type epitaxial layer 4 surrounded by the N⁺-type buried layer 3, and the other epitaxial layer 4, respectively. Since the N⁺-type buried layers 3 are provided around the N-type epitaxial layers 4, this structure may prevent an unwanted latch-up phenomenon caused by a parasitic thyristor.

Figure 3:
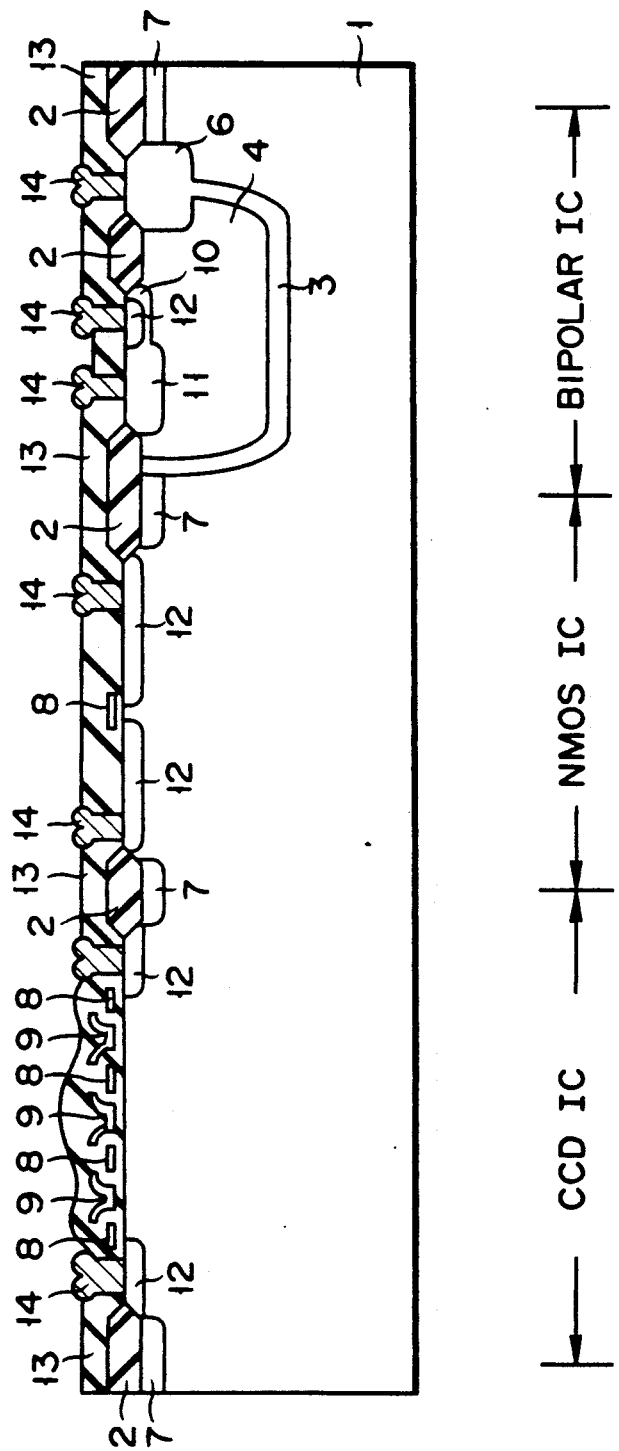
FIG. 3 is a sectional view schematically showing a semiconductor integrated circuit device according to the second embodiment of the present invention.

An integrated circuit device according to the second embodiment of the present invention is shown in FIG. 3. Reference numerals in FIG. 3 denote the same parts as in FIGS. 1 and 2, and the description thereof is omitted. In the second embodiment, CCD type and NMOS type integrated circuits are provided in a P⁻-type surface layer of a substrate 1, while a bipolar type integrated circuit is in an N-type epitaxial layer 4 surrounded by an N⁺-type buried layer 3.

Figure 4:
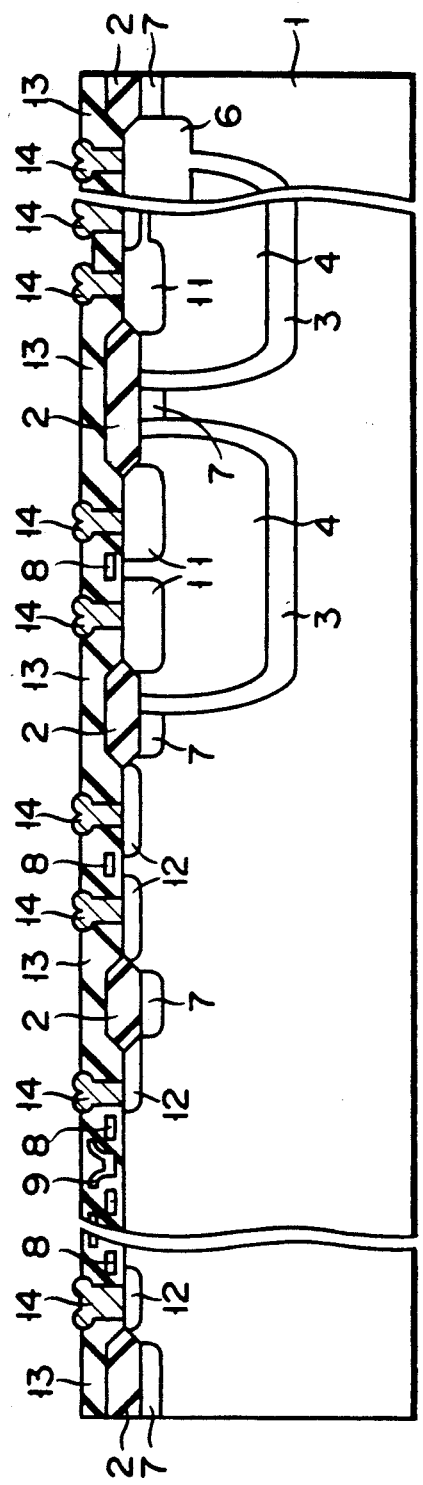
FIG. 4 is a sectional view schematically showing a semiconductor integrated circuit device according to the third embodiment of the present invention.
Figure 4:
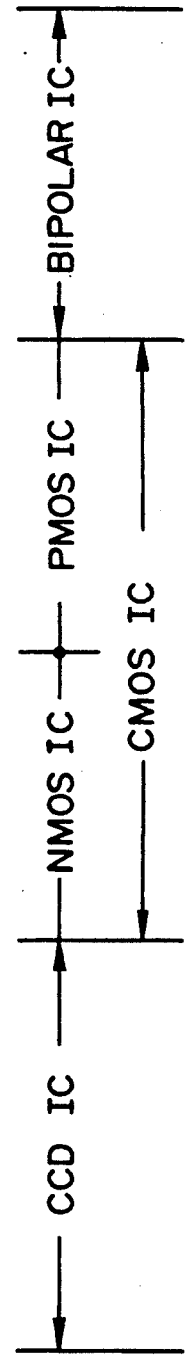

An integrated circuit device according to the third embodiment of the present invention is shown in FIG. 4. According to the third embodiment, unlike in the first embodiment, a PMOSFET of a CMOS type integrated circuit is provided in an N-type epitaxial layer 4, and an NMOSFET complementary to the PMOSFET is provided in a P⁻-type surface layer of the substrate 1. That is, a CCD type integrated circuit and the NMOSFET are in the P⁻-type surface layer of the substrate 1, while a bipolar type integrated circuit and the PMOSFET complementary to the NMOSFET are provided in one N-type epitaxial layer 4 and the other N-type epitaxial layer 4, respectively.

Though the thickness of each epitaxial layer is about 10 μm in these embodiments, it is possible to change its thickness by varying lapping and polishing amounts of the N-type epitaxial layer and the P⁻-type substrate. Accordingly, bipolar type semiconductor elements with various breakdown voltages may be made without a complicated process.

As has been described above, in the semiconductor integrated circuit device according to the preferred embodiments of the present invention, island-shaped epitaxial layers surrounded by both the field insulating layer and the buried layer having the high impurity concentration are located in the substrate having the low impurity concentration so as to be isolated from one another. This integrated circuit device can be produced by the method of the present invention without using the complicated process. Therefore, CCD type, bipolar type, and MOS type (CMOS, NMOS) integrated circuits can be efficiently provided in the single chip. Since these integrated circuits are on a single chip, various problems (e.g., countermeasure for system, high-speed operation, miniaturization for equipment, reduction in the number of pins, and low power consumption), which are subjects of conventional multichip techniques, can be eliminated.

It is further understood by those skilled in the art that the foregoing description is preferred embodiments of the disclosed device and that various changes and modifications may be made in the invention without departing from the spirit and scope thereof.

What is claimed is:

1. An integrated semiconductor device comprising:
   a semiconductor substrate of a first conductivity type;
   charge coupled device means on the substrate;
   a plurality of first buried epitaxial layers, in the substrate, of a second conductivity type and having a first impurity concentration;
   a bipolar type circuit in one of the first buried epitaxial layers, the bipolar type circuit including a bipolar transistor having a collector;
   a field oxide layer for isolating the buried first epitaxial layers from one another; and
   a plurality of second buried layers, interposed between the semiconductor substrate and each of the first buried epitaxial layers, of the second conductivity type and having an impurity concentration higher than the first impurity concentration, wherein the bipolar transistor collector is coupled to one of the second buried layers.

2. The device according to claim 1, further including an MOS type circuit in another one of the first buried epitaxial layers.

3. The device according to claim 2, wherein the MOS type circuit includes CMOS type FETs.

4. The device according to claim 1, further including an MOS type circuit in the substrate.

5. The device according to claim 4, wherein the MOS type circuit includes CMOS type FETs.

6. The device of claim 1, wherein each of the second buried layers has an edge juxtaposed to the field oxide layer.

* * * * *

UNITED STATES PATENT AND TRADEMARK OFFICE
CERTIFICATE OF CORRECTION

PATENT NO. : 5,198,880
DATED : March 30, 1993
INVENTOR(S) : Minoru TAGUCHI et al.

It is certified that error appears in the above-indentified patent and that said Letters Patent is hereby corrected as shown below:

ON THE TITLE PAGE:

Abstract, Front Page, line 10, delete "is" (second occurrence)

Signed and Sealed this

Eighth Day of March, 1994

Attest:

BRUCE LEHMAN

*Attesting Officer*    *Commissioner of Patents and Trademarks*